US005793683A

United States Patent [19]

Evans

[11] Patent Number: 5,793,683
[45] Date of Patent: Aug. 11, 1998

[54] WORDLINE AND BITLINE REDUNDANCY WITH NO PERFORMANCE PENALTY

[75] Inventor: Donald A. Evans, Williston, Vt.

[73] Assignee: International Business Machines Corporation, Armonk, N.Y.

[21] Appl. No.: 785,194

[22] Filed: Jan. 17, 1997

[51] Int. Cl.[6] .................................................. G11C 7/00
[52] U.S. Cl. ........................................ 365/200; 365/189.02
[58] Field of Search .............................. 365/200, 189.02

[56] References Cited

U.S. PATENT DOCUMENTS

| 4,691,300 | 9/1987  | Pelley, III et al. | 365/200 |
|-----------|---------|--------------------|---------|
| 5,287,310 | 2/1994  | Schreck et al.     | 365/200 |
| 5,373,471 | 12/1994 | Saeki et al.       | 365/200 |
| 5,381,370 | 1/1995  | Lacey et al.       | 365/200 |
| 5,455,798 | 10/1995 | McClure            | 365/200 |
| 5,495,446 | 2/1996  | Teel et al.        | 365/200 |
| 5,495,447 | 2/1996  | Butler et al.      | 365/200 |
| 5,502,676 | 3/1996  | Pelley, III et al. | 365/200 |
| 5,523,974 | 6/1996  | Hirano et al.      | 365/200 |
| 5,548,553 | 8/1996  | Cooper et al.      | 365/200 |

FOREIGN PATENT DOCUMENTS 1-125799  5/1989  Japan.
8-83495   of 1996 Japan.

OTHER PUBLICATIONS

B. F. Fitzgerald and D.W. Kemerer, "Memory System With High-Performance Word Redundancy", IBM Technical Disclosure Bulletin, vol. 19 No. 5, Oct. 1976, pp. 1638-1639.

"Improved Logic Redundancy Architecture With Performance Enhancements", IBM Technical Disclosure Bulletin, vol. 36, No. 1, Jan. 1993, pp. 197-199.

Primary Examiner—David C. Nelms
Assistant Examiner—Michael T. Tran
Attorney, Agent, or Firm—Whitham, Curtis & Whitham; Robert A. Walsh

[57] ABSTRACT

Wordline and bitline redundancy is provided in large memory arrays but without the performance penalty normally associated with the redundancy calculation. All redundant elements are placed in a redundant array. Defective wordlines are mapped into blocks of cells of the redundant array and defective bitlines are mapped into blocks of cells of the redundant array. The redundant array is accessed based on the result of the redundancy calculation. This allows the redundant array to be architected with very few cells per bitline and therefore it can be accessed much more quickly than the normal memory array.

4 Claims, 3 Drawing Sheets

# WORDLINE AND BITLINE REDUNDANCY WITH NO PERFORMANCE PENALTY

BACKGROUND OF THE INVENTION

1. Field of the Invention

The present invention generally relates to computer memory arrays and, more particularly, to large memory arrays having both wordline and bitline redundancy without the penalty for the redundancy calculation.

2. Background Description

Large memory arrays require some type of redundancy; that is, extra memory elements in order to repair imperfect chips and thereby lower cost of memory chips. Redundancy takes the form of redundant wordlines and redundant bitlines in order to repair different defects. The redundancy calculation is the process of determining if the applied memory address matches defective addresses stored in fuse banks. If the applied address does match a particular fuse address, then redundant memory elements corresponding to that fuse address are used to replace the defective memory elements.

In the prior art, this redundancy calculation has to be completed prior to accessing the normal memory array in order to determine which, if any, redundant bitline is to be accessed. This is because the time required to read or write a redundant bitline is at least as long to access a normal bitline.

SUMMARY OF THE INVENTION

It is therefore an object of the present invention to provide wordline and bitline redundancy in large memory arrays but without the performance penalty normally associated with the redundancy calculation.

According to the invention, defective wordlines map into blocks of cells in the redundant array, and defective bitlines also map into blocks of cells in the redundant array. The access of the redundant array is based on the outcome of the redundancy calculation. This allows the redundant array to be architected with very few cells per bitline and, therefore, the redundant array can be accessed much more quickly than the normal memory array.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
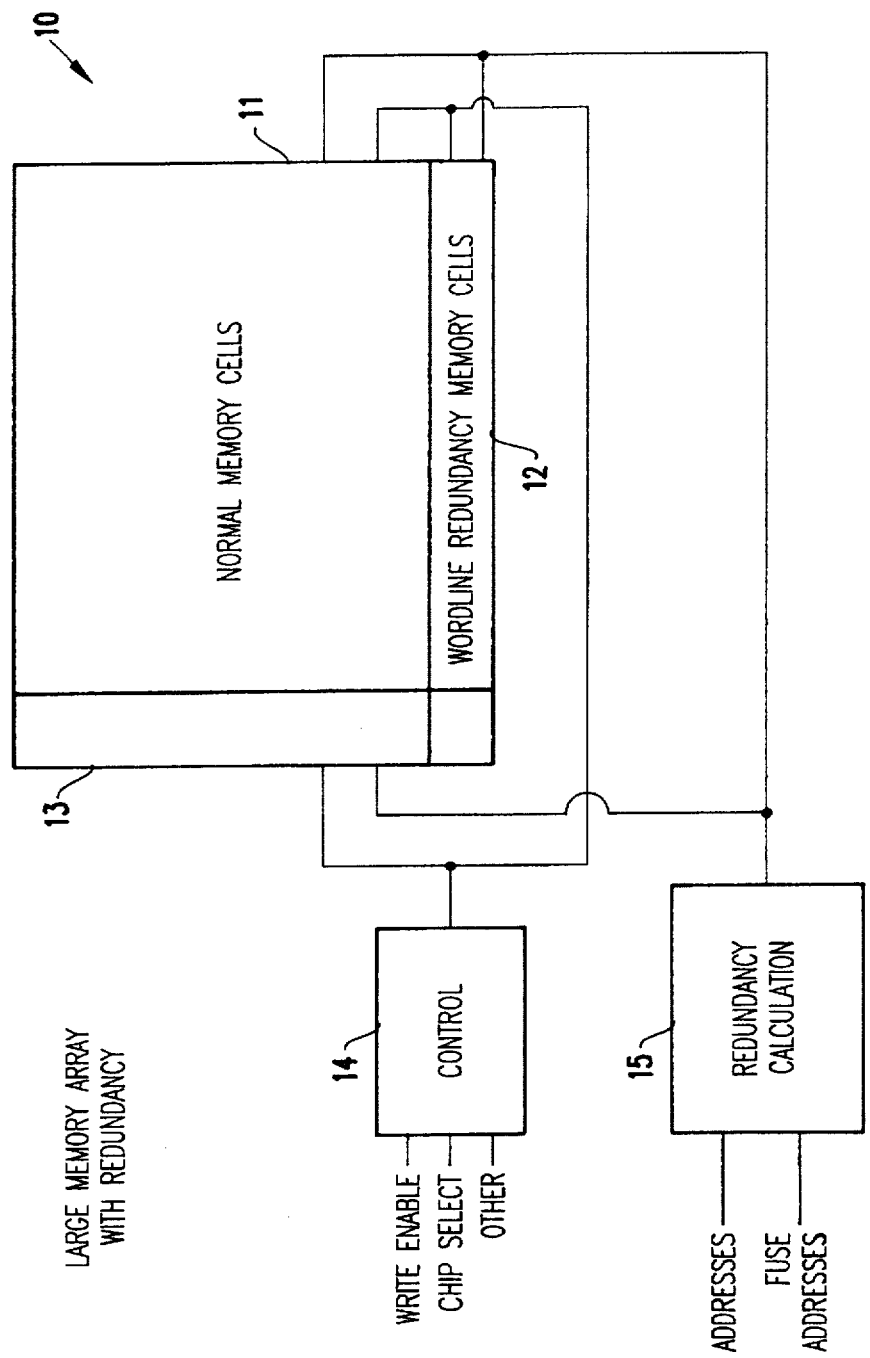
FIG. 1 is a block diagram showing a prior art large memory array with both wordline and bitline redundancy and redundancy calculation.

Referring now to the drawings, and more particularly to FIG. 1, there is shown an example of a large memory array with redundancy as implemented in the prior art. The memory array 10 comprises an array of normal memory cells 11 and arrays of wordline redundancy memory cells 12 and bitline redundancy memory cells 13. The usual control signals from control circuit 14, including write enable, chip select, etc., are applied to the memory array 10. Addresses for read and write access to the memory array are applied to the redundancy calculation 15 and, depending on the result of the redundancy calculation, are applied to the array of normal cells 11 or the arrays 12 and 13.

If the applied address input to the redundancy calculation 15 matches a particular fuse address corresponding to defective cells in the array 11 of normal cells, then the redundant memory elements in arrays 12 and 13 corresponding to that fuse address are used to replace the defective memory elements. This redundancy calculation has to be completed prior to accessing the array of normal cells 11 in order to determine which, if any, redundant bitline is to be accessed. This delay causes a performance penalty.

Figure 2:
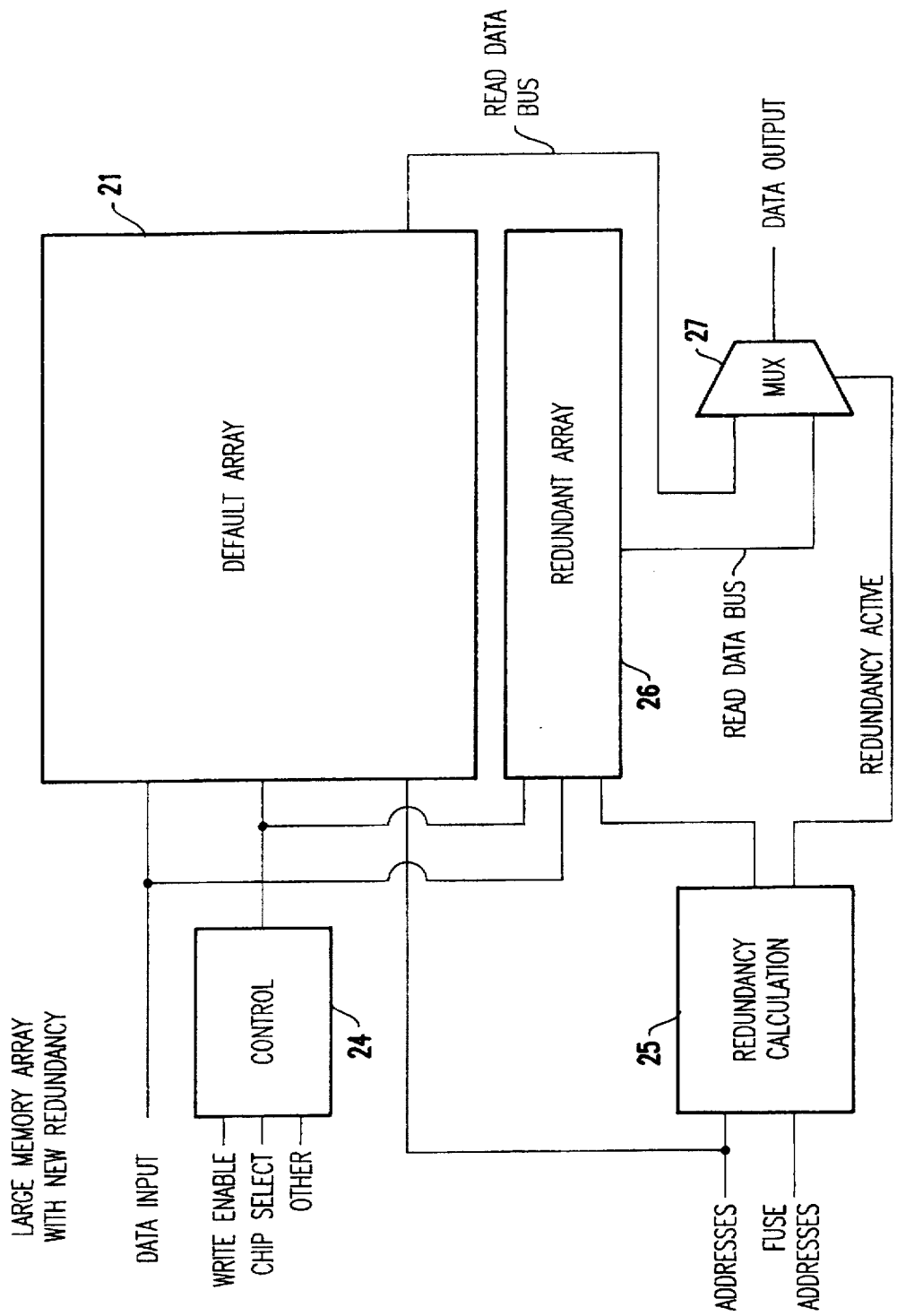
FIG. 2 is block diagram showing the large memory array according to the invention with both wordline and bitline redundancy with no performance penalty.

FIG. 2 shows the memory architecture according to the present invention. This architecture includes an array of normal memory cells 21, a control circuit 24 and a redundancy calculation 25. However, the wordline redundancy memory cells and the bitline redundancy memory cells are mapped into blocks of cells of a redundant array 26. The address for read or write access is provided directly to the array of normal memory cells 21 as well as the redundancy calculation 25. Data input and control signals are supplied to both the array of normal memory cells 21 and the redundant array 26. Data read out of the array of normal memory cells 21 and the redundant array 26 are supplied to a multiplexer 27. The selection signal to the multiplexer 27 is supplied by the redundancy calculation 25.

At the start of a given cycle, the applied address is sent to both the normal array 21 and the redundancy calculation 25. While accessing the normal array, the redundancy calculation 25 determines if the applied address matches any defective addresses stored in the fuse banks, and if so, accesses the redundant array 26.

During a write cycle, data is written to the normal array 21, but also to the redundant array 26 if the redundancy calculation determines the address corresponds to defective memory elements in the normal array. The extra delay it takes to do the redundancy calculation is made up for in the fast redundant array 26, such that, the time it takes to do the redundancy calculation and write to the redundant array 26 is no more than the time it takes to write to the normal array 21.

During a read cycle, data is read out of the normal memory array 21, and also the redundant array 26 if the redundancy calculation determines the address corresponds to defective memory elements. If the redundant array 26 is accessed during a read, then the output of the redundant array 26 is multiplexed by multiplexer 27 through to the output; otherwise, the output of the normal array is multiplexed through to the output. Like the write cycle, the time it takes to do the redundancy calculation and access the redundant array is no more than the time it takes to read data from the normal array.

As described above, the redundancy calculation and redundant array access is done in parallel with the normal array access. By mapping the redundant bitline address space into blocks of cells of the redundant array, the redundant array 26 can have very few cells per bitline and be much faster than the normal array 21. As long as the redundancy calculation and redundant array access is no greater than the delay through the normal array, then the normal array performance is not degraded by the redundancy.

This redundancy technique takes redundancy out of the critical path for both wordline and bitline redundancy. Since defective bitlines are mapped into the redundant array 26 in both the wordline and bitline dimensions, the redundant array 26 can be designed to have many fewer cells per bitline than the default or normal array 21. This causes the redundant array 26 access to be much quicker than the default array access allowing time for the redundancy calculation. The output of the redundant array 26 is then multiplexed or dotted into the default array output with the REDUNDANCY_ACTIVE signal to determine which data is to be used during a read operation.

Figure 3:
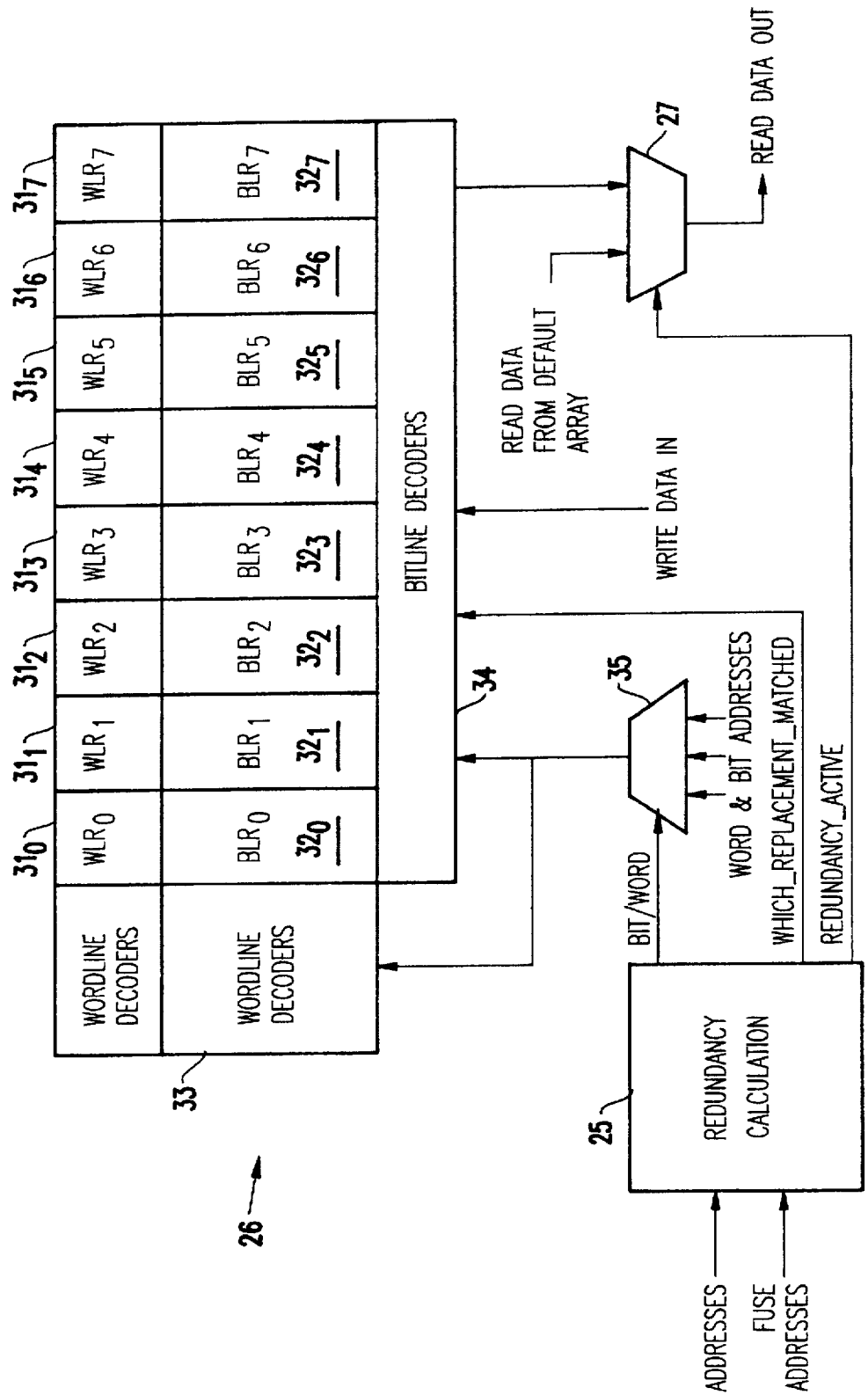
FIG. 3 is a more detailed block diagram showing how the redundant wordline cells and the redundant bitline cells of the memory array of FIG. 2 are mapped into the redundant array as blocks of cells.

FIG. 3 shows in more detail the redundant memory array 26 and how this array is accessed. The redundant wordline blocks of cells $31_0$ to $31_7$ and the redundant bitline blocks of cells $32_0$ to $32_7$ are mapped into the array 26 as blocks of cells. Thus, in this example, the redundant array 26 provides eight blocks of cells to replace eight default wordlines and eight blocks of cells to replace eight default bitlines. It will, of course, be recognized by those skilled in the art that the amount of redundancy could vary. Wordline decoders 33 decode the word addresses, and bitline decoders 34 decode the bit addresses. These addresses are supplied via selector 35 controlled by the redundancy calculation 25. The redundancy calculation also outputs a signal WHICH_REPLACEMENT_MATCHED to the bitline decoders 34.

This architecture has the advantage that if a defect occurs in the redundant array 26, it is more likely to effect only one replacement. For example, in the prior art wordline redundancy, a defect that occurs on two adjacent cells of two adjacent redundant wordlines would make both of those redundant wordlines unusable. With the redundant wordlines mapped into blocks as shown in FIG. 3, a defect is much more likely to make only one wordline replacement unusable. The key behind this redundant memory array is that default wordlines from the default array are mapped into both the wordline and bitline dimension of the redundant array. What this means is that the word addresses that were used for the default wordlines are used as both word and bit addresses in the redundant array. For bit redundancy, a bitline of the default or normal array 21 is mapped into both the wordline and bitline dimension of the redundant array 26. The bitline addresses of the default array 21 are used in both the word and bit dimension of the redundant array 26.

The redundancy calculation 25 determines if the address matches any of the wordline or bitline redundancy fuse banks. If the address matches a wordline fuse bank, then the block of cells corresponding to that fuse bank is accessed in the redundant array. Since wordline redundancy and bitline redundancy requires two different address mappings to access the redundant array, the signal BIT/ WORD selects how the addresses are mapped into the redundant array 26. In the event that an address matches both a wordline and bitline fuse bank, then a priority decoder in the redundancy calculation block 25 selects only one or the other. For example, if a defective wordline and a defective bitline overlap, the cell at the overlap will match both a redundant wordline fuse bank and a redundant bitline fuse bank. When the address corresponding to that cell is applied, bitline redundancy or wordline redundancy could be used so only one must be chosen.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A large memory array with wordline and bitline redundancy comprising:

a default array of normal memory cells, some of which may be defective;

a redundant array of memory cells wherein a defective wordline of the default array is mapped into a block of cells of the redundant array and a defective bitline of the default array is mapped into a block of cells of the redundant array;

control means applying control signals to both the default array and the redundant array;

redundancy calculation means receiving addresses for accessing data, the addresses being directly applied to the default array, the redundancy calculation means further receiving fuse bank addresses corresponding to defective elements of the default array and determining if an addresses applied to the default array matches any of the fuse bank addresses and, if so, accessing the redundant array with the correct address mapping and generating a select signal; and a multiplexer receiving data output from both the default array and the redundant array and controlled by the select signal from the redundancy calculation means for outputting data.

2. The large memory array recited in claim 1 wherein one or more redundant elements in the redundant array are mapped into blocks of cells to reduce a likelihood of a defect in the redundant array affecting more than one replacement element.

3. The large memory array recited in claim 2 wherein the redundant array includes a selector responsive to the redundancy calculation means for selecting which of the wordline and bitline address mappings is to be used to access the redundant array.

4. A method of managing a large memory array having a default array of normal memory cells and a redundant array of memory cells comprising the steps of:

mapping a defective wordline or a defective bitline of the default array into a block of redundant cells of the redundant array such that bit addresses used to address defective wordlines in the default array are used as both word and bit addresses in the redundant array and word addresses used to address defective bitlines in the default array are used as both word and bit addresses in the redundant array;

applying control signals and data input to both the default array and the redundant array;

determining from addresses for accessing data applied to the default array and fuse bank addresses corresponding to defective elements of the default array if an addresses applied to the default array matches any of the fuse bank addresses and, if so, accessing the redundant array with the correct address mapping and generating a select signal; and receiving data output from both the default array and the redundant array and outputting data received from the default array or the redundant array depending on the select signal.

* * * * *